United States Patent [19]

Kiley

[11] Patent Number: 4,896,054
[45] Date of Patent: Jan. 23, 1990

[54] OPTIONAL SINGLE OR DOUBLE CLOCKED LATCH

[75] Inventor: Donald B. Kiley, Shelburne, Vt.

[73] Assignee: International Business Machines Corporation, Armonk, N.Y.

[21] Appl. No.: 802,923

[22] Filed: Nov. 29, 1985

Related U.S. Application Data

[63] Continuation of Ser. No. 519,338, Aug. 1, 1983.

[51] Int. Cl.⁴ .............................................. H03K 3/356
[52] U.S. Cl. ................................. 307/272.1; 307/279
[58] Field of Search ............... 307/269, 272 A, 272 R, 307/279, 465, 468, 480, 481, 291; 377/78–81, 105, 106, 117

[56] References Cited

U.S. PATENT DOCUMENTS

| | | | |
|---|---|---|---|
| 4,334,157 | 6/1982 | Ferris | 307/291 |
| 4,387,294 | 6/1983 | Nakamura et al. | 377/78 |
| 4,395,645 | 7/1983 | Pernyeszi | 307/270 X |
| 4,477,738 | 10/1984 | Kouba | 307/269 X |
| 4,495,629 | 1/1985 | Zasio et al. | 307/272 A X |

OTHER PUBLICATIONS

Millman and Halkias, *Integrated Electronics: Analog and Digital Circuits and Systems*, McGraw-Hill Book Co., New York, 1972, pp. 311–312, 327–328, 331–335.

Taub and Schilling, *Digital Integrated Electronics*, McGraw-Hill Book Co., New York, 1977, pp. 260–262, 268–269.

Mead and Conway, *Introduction to VLSI Systems*, Addison-Wesley Pub. Co., Reading, Mass., Oct. 1980, pp. 256–257.

*Primary Examiner*—David Hudspeth
*Attorney, Agent, or Firm*—Francis J. Thornton

[57] ABSTRACT

This is related to a logic circuit which requires a double clocking latch during testing of the circuit to prevent race or flushing of the scan rings from occuring during the test mode and yet can be operated to capture and hold output data during the operation mode with stable data inputs. The preferred embodiment is a programmable latching circuit comprising a double ended cross coupled circuit having an input and an output and having first and second programmable legs and a third non-programmable leg with the first programmable leg cross coupled to the third leg and the second programmable leg being switchably cross coupled to the third leg.

29 Claims, 2 Drawing Sheets

OPTIONAL SINGLE OR DOUBLE CLOCKED LATCH

This is a continuation of a co-pending application, Ser. No. 519,338 filed on Aug. 1, 1983.

BACKGROUND OF THE INVENTION

This relates generally to logic circuits employing shift registers and more particularly to logic circuits which require double clocking latches during testing of the circuits and single clocking latches when the circuits are operating in their non-test or function mode.

Microprocessors, which employ a large number of latching circuits, require both master and slave latching circuits with a plurality of clocks arranged such that the shift registers can be latched during the testing mode, but operated as an unlatched register during the normal or function operation mode. In the prior art this is accomplished by using master and slave circuits coupled in series. Such complex circuits can not use common tests as stuck fault testing.

The present invention is directed toward a register circuit that has, during operation, stable data inputs and thus requires only a single clock to capture and hold the output data, but during testing must act as a shift register latch. In order to prevent race conditions in such shift register latches they require double clocking to scan data into and out of the scan rings formed of the registers.

In particular, the invention described a latching circuit that will operate with a single clocked circuit under one set of selected conditions and under a different set of selected conditions will operate as a dynamic master latch followed by a static slave latch, each set by different clocks. If desired, a third clock, which is optional, can be used to provide the scan features to set internal test points and read internal logic points on the circuit.

The present invention thus provides a simple circuit that will meet the level sensor scan design for automatic generation of stuck fault test while providing a simple circuit which will reduce logic delay.

BACKGROUND ART

U.S. Pat. No. 4,004,170 to IBM describes a MOSFET latching circuit which employs a bi-stable latch that is arranged such that one side drives an enhancement mode device while the other side drives a depletion mode device connected in push-pull arrangement.

U.S. Pat. No. 3,993,919 also to the IBM Corporation, describes a programmable latch for logic array which uses three different metallization patterns to provide three different latches. By adding a device and changing selected interconnections a J-K flip-flop can be converted into an AND polarity hold and a gated polarity hold circuit.

SUMMARY OF THE INVENTION

The present invention is especially directed towards a programmable latching circuit which can serve as either a single or double latch which can be operated to capture and hold output data during operation mode with stable data inputs while being operable as a double clocked shift register latch during the test mode, thus preventing race or flush in the scan rings in the test mode from occuring.

More particularly the invention is a programmable latching circuit comprising; a double ended cross coupled circuit having an input and an output and having first and second programmable legs and a third non-programmable leg, with the first programmable leg cross coupled to the third leg and the second programmable leg being switchably cross coupled to the third leg.

The invention can be further modified by programming the first programmable leg by a selected input signal and the second programmable leg by the complement of the selected input signal.

From the foregoing it can be seen that an object of the present invention is to provide an improved register latch having increased density as well as smaller size.

A further object of the invention is to provide a shift register latch which is double clocked during test, but during functional operation mode acts as a single clock latch thus resulting in better power performance.

Still another object of the invention is to provide a simple register circuit that can be readily and easily tested with DC tests such as stuck fault testing.

These and other objects of the present invention will become more apparent when taken in conjunction with the following descriptions and drawings wherein there is set forth a specific embodiment of the present invention.

DESCRIPTION OF THE PREFERRED EMBODIMENT

Register stacks are intrinsic to selected microprocessors some of which require outputs of 16 high speed registers at local storage. Each of these registers is required to be at least 32 bits long and made even longer if parity is required for the 32 bit processor. Such registers that are necessary and provide internal logic during the operation mode must be tested. However, during the test mode they must be treated as if they were shift register latches. As is well known shift register latches require two clocks to scan data into and out of the shift register scan rings in order to prevent race or flush of the scan rings. However, during operation mode two clocks are not needed and indeed may be detrimental to the power or speed characteristics of the register. Only a single clock is necessary to capture and hold the output data during the operation mode.

Figure 1:
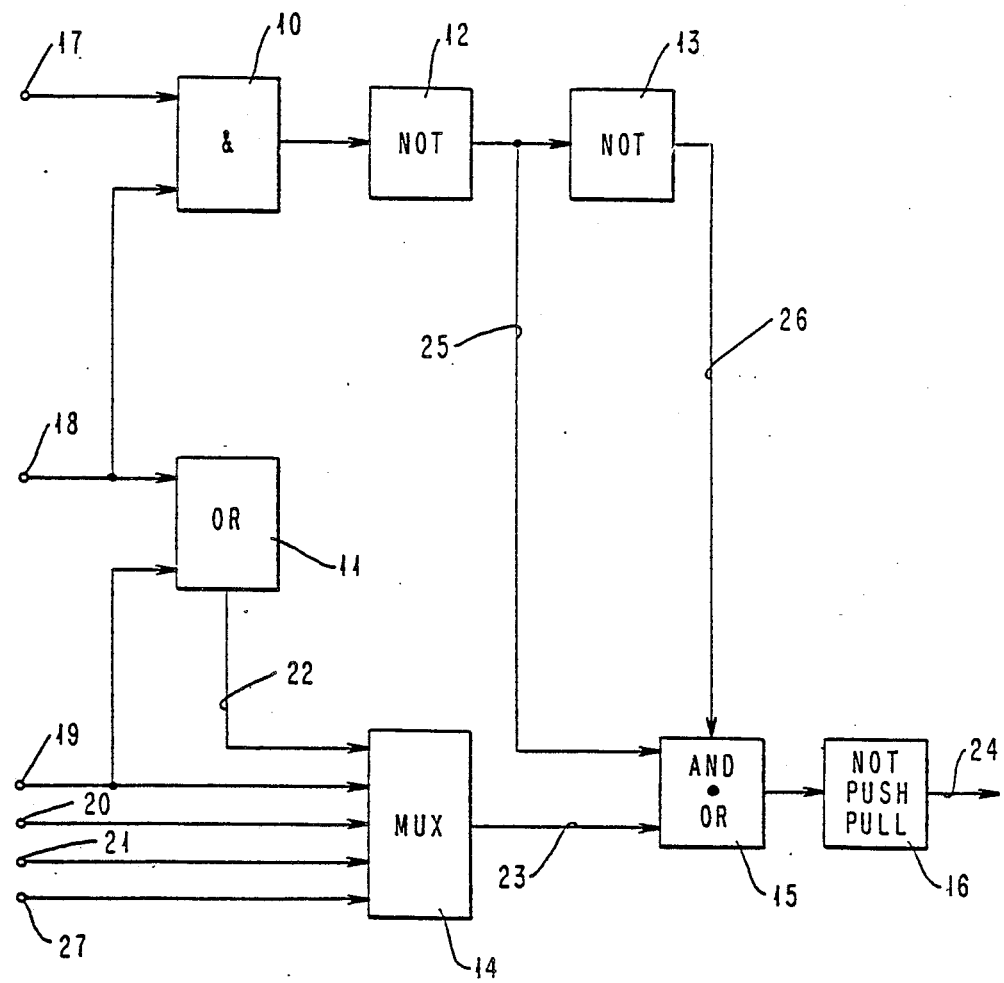
FIG. 1 illustrates in block form a complete register embodying the present invention.

Turning now to the figures, a register circuit built in accordance with the present invention will be described in great detail as to its construction and operation. In FIG. 1 there is shown a block diagram of the apparatus illustrating the logic of the invention. This comprises a negated and or hand circuit 10, a negated OR or NOR circuit 11, hereinafter referred to as "AND" and "OR" circuits respectively, a pair of serial NOT circuits 12 and 13, a multiplexer 14, and an AND/OR invert circuit 15 hereinafter referred to as an AND/OR circuit, in series with a NOT push-pull circuit 16. A first clock pulse is coupled into the AND circuit 10 via node 17. An input is also fed into this AND circuit via node 18 which also leads to OR circuit 11. Also feeding into the OR circuit 11 is a second clock pulse via node 19, this node 19 feeds the multiplexer 14 together with a data input signal node 20 and a scan input signal node 21. Whenever the input pulse on node 18 is low the entire circuit shown operates in a single clock mode and any signal that appears upon node 17 remains invalid since it must be ANDED with a high input on node 18 to produce an output feeding to the serial NOT circuits 12 and 13 and hence to the AND/OR circuit 15. Thus, the only clock pulse which is effective, when the input 18 is low, is the clock pulse appearing upon the node 19 which is coupled into the OR circuit 11 and into the multiplexer 14. When this node 19 rises the OR circuit 11 becomes active and transmits a signal via line 22, to the multiplexer circuit 14. When this occurs the multiplexer 14 is able to receive information via either the scan line 21 or the data line 20. Information so fed into the multiplexer is passed, via line 23, into the AND/OR circuit 15 to activate the NOT push-pull circuit 16 and provide a suitable output level on the output line 24.

Conversely when node 18 is high the circuit operates in a double clock mode. In this case operation of the circuit depends on coincidence of positive signals from both the first clock on node 17, the input 18 and the second clock 19. When node 18 is high any positive clock pulse appearing on node 17 becomes effective to activate the AND circuit 10 which then provides an output to the serial NOT circuits 12 and 13. This activity causes suitable pulses to appear on lines 25 and 26 leading to the AND/OR circuit 15 and causes the NOT push-pull circuit 16 to provide a suitable data output on line 24.

Simultaneously, because the OR circuit 11 is active and line 22 is low, the multiplexer circuit 14 is rendered inactive and neither data or scan pulses are permitted to be transferred from either node 20 or 21 through the multiplexer 14.

Figure 2:
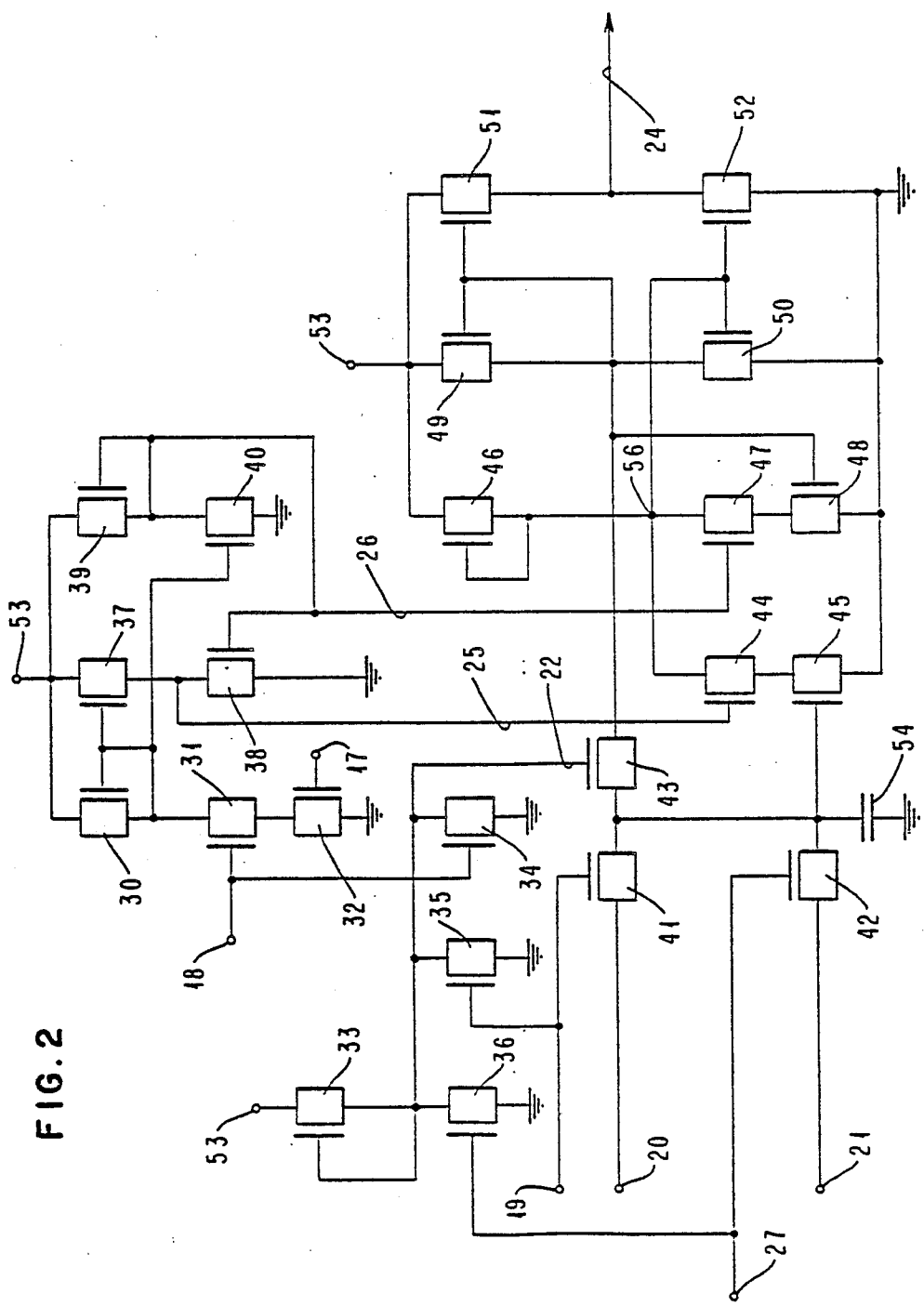
FIG. 2 illustrates in schematic form the register of FIG. 1.

FIG. 2 shows in great schematic detail the devices and the arrangements of the circuit of FIG. 1.

In this circuit transistors 30, 31, and 32 comprise AND circuit 10 while devices 33, 34, 35, and 36 comprise the OR circuit 11. Devices 39 and 40 comprise NOT circuit 12, devices 37 and 38 comprise NOT circuit 13, transistors 41, 42, and 43 comprise multiplexer circuit 14 while transistors 44, 45, 46, 47, and 48 comprise the AND/NOT circuit 15 and devices 49, 50, 51, and 52 comprise the NOT push-pull circuit 16.

The AND circuit 10 comprises a load transistor 30, and two input transistors 31, and 32 arranged in series. The load transistor 30 has its source coupled to a voltage source 53 and its drain coupled through input transistors 31 and 32 to ground and also coupled to its own gate or control electrode and the gate of load transistor 37 and the gate of source follower transistor 40. Transistor 31 has its gate coupled to the node 18 and the gate of transistor 34 in the OR circuit 11, while the gate of transistor 32 has its gate coupled to node 17. In the OR circuit 11, comprised of transistors 33, 34, 35, and 36, transistor 33 is a load transistor having its source coupled to voltage source 53 while its drain is coupled to its own gate, to the line 22 and to the source of parallel decode transistors 34, 35, and 36 whose drains are all coupled to ground. Because it is desirable to permit only a scan or a data pulse into the latch of the invention an additional clocking node 27 is provided. This node 27 controls the scan input transistor 42 while node 19 controls the data input transistor 41. The gate of transistor 35 is coupled to the node 19 while the gate of transistor 36 is coupled to the node 27. The NOT circuits 12 and 13 comprise load transistors 37 and 39 and source follower transistor 38 and 40. In particular in circuit 12 load transistor 37 has its source coupled to the voltage source 53 and its drain coupled through transistor 38 to ground and to the line 25. The NOT circuit 12 also comprises a load transistor 39 whose source is coupled to voltage source 53 and whose drain is coupled to its own gate and to the gate of transistor 38 and to line 26 and to ground through transistor 40 whose gate is coupled to the gate of transistors 30 and 37.

The multiplexer 14 comprises three transistors 41, 42, and 43. The source of transistor 41 is coupled to the data node 20 and its drain is coupled to the source of transistor 43, the capacitor 54 and the drain of transistor 42 whose source is coupled to the scan node 21. The gate of switching transistor 43 is coupled to the line 22.

The AND OR circuit 15 consists of programming transistors 44 and 47, load transistor 46 and gating transistors 45 and 48. Load transistor 46 has its source coupled to the voltage source 53 and its drain is coupled through both programming transistors 44 and 47 and through gating transistors 45 and 48 in series with the programming transistors to ground. The gate of transistor 44 is coupled to line 25 while the gate of transistor 47 is coupled to line 26. The gate of transistor 45 is coupled to capacitor 54, the drains of transistors 41 and 42 and through the switching transistor 43 to the gate of transistor 48. It should be noted at this time that the capacitor 54 can be separate physical capacitor as shown or can be the gate capacitance of transistor 45 or a parasitic capacitance. The NOT push-pull circuit 16 consists of load transistor 49, an inverting source follower transistor 50, push transistor 51 and pull transistor 52. Transistors 49 and 51 both have their sources coupled to the voltage source 53. The drain of transistor 49 is coupled to the drain of switching transistor 43, the gate of gating transistor 48 and through the inverting source follower transistor 50 to ground. Transistor 50 has its gate coupled to the drain of load transistor 46 and the sources of programming transistors 44 and 47. The source of push transistor 51 is coupled to the voltage source 53 and its drain coupled to the output line 24 and through pull transistor 52 to ground. The gate of pull transistor 52 is coupled to the gate of transistor 50, while the gate of transistor 51 is coupled to the drain of load transistor 49.

Transistors 43 through 52 and the capacitance 54 form a double ended cross coupled programmable latch circuit having first and second programmable legs and a non-programmable leg with the first leg cross coupled to the third leg and the second leg switchably cross coupled to the third leg so that the second leg may be selectively removed from the circuit.

The above described logic circuit operates as follows. Initially the single clock mode will be described. It will be assumed that node 17 is normally on and that node 18 is low. With node 17 on transistor 32 is on however with node 18 off transistor 31 is off and thus no current flow occurs through either transistors 31 or 32, i.e., the AND circuit 10 is not active and the transistors 30, 37, and 40 are all on. When the node 18 is off transistor 34 is also off. With transistor 40 being on line 26 is held low and transistor 38 is also off. This causes line 25 to be high and transistor 44 to be on. With transistor 44 on if either of the nodes 19 or 27 go high then either data can be written in capacitor 54 via node 20 or scan information can be entered via node 21 depending upon what node 19 or 27 has gone high. If either of the nodes 19 or 27 rises, either transistors 35 or 36 turns on causing line 22 to be pulled low and turning off transistor 43. Thus data or scan information can now be applied via either node 20 or 21 through transistors 41 or 42 and charge the capacitor 54 positively so as to turn on transistor 45.

When transistor 45 comes on current is now drawn through transistors 44 and 45, since line 25 is also high pulling node 56, i.e., the source of transistor 47, low. When node 56 goes low transistors 50 and 52 are held off and the gate of transistor 51 rises turning transistor 51 on and pushing the output line 24 toward the voltage source 53. When nodes 18 and 19 and 27 are all low the three transistors 34, 35, and 36 are all off and line 22 is high causing transistor 43 to turn on and set the gate of transistors 51 and 48 at the level of the capacitor 54. If capacitor 54 is low then transistors 45, 48 and 51 are turned off and transistors 50 and 52 are on pulling down the output line 24 and if it is high transistors 48 and 51 are turned on and transistors 50 and 52 are turned off pushing up the output line 24.

If, however, the device is to be used in a double clock mode the node 18 is brought up and since the node 17 is normally high current is drawn through devices 31 and 32 pulling the gates of transistors 30, 37, and 40 low and turning these devices off. When device 40 turns off the line 26 coupled to the source of device 40 rises turning on transistor 38 and pulling line 25 low. When line 26 rises the transistor 47 turns on. A positive signal now appearing at the gate of transistor 48 will cause the node 56 to be pulled low shutting off transistors 50 and 52 causing line 24 to rise. Similarly, if the gate of transistor 45 is held low by the capacitor 54 then transistors 49 and 51 are off and node 56 remains high holding on transistors 50 and 52 causing line 24 to be pulled towards ground.

It should be particularly noted that devices 41 through 52 in particular comprise a programmable latching circuit having a pair of cross coupled circuits comprising two programmable legs and a third non-programmable leg such that the first programmable leg is selected by a signal and the other programmable leg is selected by the complementary of the signal.

Thus, there has been described a circuit which during operation can have selected data inputs and require only a single clock to capture and hold the data, but during the test must act as a shift register latch in order to prevent a race condition that requires two clocks to scan data into and out of the scan rings formed by the registers.

While the invention has been particularly described with reference to the preferred embodiments thereof it will be understood by those skilled in the art that changes in form and details can be made in the foregoing preferred embodiments without departing from the spirit and scope of the invention. For example, one skilled in the art could readily implement the invention in a bipolar transistor configuration.

What is claimed is:

1. A programmable latching circuit comprising:
   a double-ended cross coupled circuit having input means and output means,
   said double-ended cross coupled circuit having first and second programmable legs and a third non-programmable leg,
   said first programmable leg being coupled to said output means and cross coupled to said third non-programmable leg and comprising a first programming transistor and a first gating transistor,
   said second programmable leg being coupled to said input means and said output means and switchably cross coupled to said third non-programmable leg and comprising a second programming transistor and a second gating transistor, and
   each of said programming transistors and said gating transistors having a respective control electrode,
   said third non-programmable leg comprising a transistor having a control electrode coupled to said first and second programming transistors.

2. The circuit of claim 1 wherein said first programmable leg is coupled to means providing a first signal and said second programmable leg is coupled to means providing a second signal that is the complement of said first signal.

3. The circuit of claim 1 wherein said input means includes a data input coupled to said second programmable leg.

4. The circuit of claim 3 wherein said first programmable leg is coupled between a first load transistor and ground and said first load transistor is coupled to a voltage source, and
   said second programmable leg is coupled between said first load transistor and ground, and
   said third leg is coupled between said voltage source and ground and comprises a second load transistor in series with an inverting source follower transistor having a control electrode, and
   the control electrode of the inverting source follower transistor is coupled at a junction between said first load transistor and said first and second programming transistors, and
   said second load transistor and said inverting source follower transistor being switchably coupled to the control electrode of said second gating transistor.

5. The circuit of claim 3 wherein said output means includes an output line, a push transistor coupled between a voltage source and the output line and having a control electrode coupled to the voltage source through a first load transistor and to the control electrode of said first gating transistor, and
   a pull transistor coupled between ground and the output line and having its control electrode coupled to the control electrode of the inverting source follower transistor and to the voltage source through a second load transistor.

6. The circuit of claim 4 wherein said circuit is further provided with capacitive storage means coupled to the control electrode of said second gating transistor.

7. The circuit of claim 6 wherein there is further provided a transistor coupled between the data input and said gate of said second gating transistor.

8. The circuit of claim 1 wherein said input means includes a scan input coupled to said second programmale leg.

9. The circuit of claim 1 wherein input means includes a data input and a scan input coupled to said second programmable leg.

10. A logic circuit that has, during operation stable data inputs and requires but one of two clock inputs to capture and hold output data but requires, for testing, two clock inputs comprising;
    a multiplexer circuit,
    a negated AND circuit coupled to and driving a pair of NOT circuits and having a first input and a first clock input,
    each of said NOT circuits having an output coupled to an AND/OR invert circuit,
    a second clock input, a data input and a scan input coupled to said multiplexer circuit, said multiplexer circuit coupling said scan or data inputs to said AND/OR invert circuit, a negated OR circuit coupled to and controlling said multiplexer circuit, said second clock input and said first input being coupled to and driving said negated OR circuit, and a push-pull circuit coupled to said AND/OR invert circuit to provide an output indicative of the output of said multiplexer.

11. The logic circuit of claim 10 wherein said multiplexer circuit comprises an input transistor, coupled to a third clock input and to an input node, and coupled in common with a node having a capacitance coupled thereto and a switching transistor, said switching transistor having a control electrode, said AND/OR invert circuit comprises first and second programming transistors, each of which is coupled to a first load transistor and to ground through a respective gating transistor, a first one of said gating transistors having a control electrode coupled to said node having a capacitance coupled thereto and the other of said gating transistors having a control electrode coupled through said switching transistor to the control electrode of said first one of said gating transistors, and said push-pull circuit comprises a second load transistor coupled to ground through an inverting source follower transistor, said second load transistor having a control electrode, the control electrode of said second load transistor being coupled to the switching transistor and the control electrode of said other gating transistor, a push transistor, having a control electrode coupled to said both of said gating transistors, coupled between a voltage source and an output line, and a pull transistor, coupled between said output line and ground.

12. The logic circuit of claim 11 wherein said negated AND circuit comprises a first input transistor, having a control electrode coupled to receive said first input, in series, between a voltage source and ground, with a second input transistor having a control electrode coupled to receive said first clock signal, and a load transistor, said first NOT circuit comprising a load transistor in series with a first source follower transistor, said second NOT circuit comprising a load transistor in series with a second source follower transistor coupled between said voltage source and ground, the output of said second NOT circuit being coupled to one of said pair of programming transistors in said AND/OR invert circuit, said second source follower transistor having a control electrode the output of the first NOT circuit being coupled to the control electrode of the second source follower transistor of the second NOT circuit and to the control electrode of the other of said pair of programming transistors of the AND/OR invert circuit, and the negated OR circuit comprising a load transistor and a plurality of parallel decode transistors, the output of said negated OR circuit being coupled to the control electrode of the switching transistor in said multiplexer circuit.

13. A latch comprising:

a circuit having an input means and an output means, and first and second and third legs, a first load transistor coupled between a voltage source and a first junction, a second load transistor coupled between the voltage source and a second junction, said first leg being coupled between said first junction and ground, and comprising a first transistor and a second transistor, said first leg further being coupled to said output means, said second leg being coupled between said first junction and ground and comprising a third transistor in series with a fourth transistor, said second leg further being coupled to said input means, said first, second, third and fourth transistors each having a respective control electrode, said third leg being coupled between said second junction and ground and comprising a fifth transistor having a control electrode, the control electrode of the fifth transistor being coupled to the first junction, the second junction being coupled, through a sixth transistor, to the control electrode of said fourth transistor, and to the control electrode of said second transistor.

14. The latch of claim 13 wherein;

said output means includes an output line, a seventh transistor having a control electrode, coupled between the voltage source and the output line and having its control electrode coupled to the voltage source through said second load transistor and to the control eletrode of said second transistor, and an eighth transistor having a control electrode, coupled between ground and the output line and having its control electrode coupled to the control electrode of the fifth transistor and to the voltage source through the first load transistor.

15. The latch of claim 14 wherein;

said input means is coupled to a capacitive means, to a first signal source through a ninth transistor and to a second signal source through a tenth transistor.

16. A programmable latching circuit comprising:

a double-ended cross coupled circuit having an input means and an output means, said double-ended cross coupled circuit having first, second and third legs, said first leg being coupled to said output and cross coupled to said third leg, and comprising a first transistor and a second transistor, and having an output, said second leg being coupled to said input means and said output means and switchably cross coupled to said third leg and comprising a third transistor and a fourth transistor, and having an output, and said third leg comprising a fifth transistor and a sixth transistor and having an output, said first, second, third, fourth, fifth and sixth transistors each having a respective control electrode, said sixth transistor having its control electrode coupled to the output of the first and second legs.

17. The circuit of claim 16 wherein the control electrode of the fifth transistor is coupled to the output of the first and the second leg.

18. The circuit of claim 16 wherein said input means includes a data input coupled to said second leg.

19. The circuit of claim 16 wherein said first leg is between a voltage source and ground and said first transistor has a source electrode coupled to a drain electrode of the second transistor, and said second leg is coupled between said voltage source and ground and said third transistor has a source electrode coupled to a drain electrode of the fourth transistor, and said third leg is coupled between said voltage source and ground and said fifth transistor has a source electrode coupled to a drain electrode of the sixth transistor, the control electrode of the fifth transistor being coupled to the output of said first and second legs and the output of the third leg being connected to the control electrode of the first transistor and switchably coupled to the control electrode of said third transistor.

20. The circuit of claim 19 wherein said circuit is further provided with capacitive storage means connected to the control electrode of said fourth transistor.

21. The circuit of claim 20 wherein there is further provided a seventh transistor coupled between the input means and the control electrode of said fourth transistor.

22. The circuit of claim 21 wherein said input means further includes a scan input coupled to said second leg.

23. The circuit of claim 20 wherein input means includes a data input and a scan input coupled to said second leg.

24. A logic circuit that has, during operation stable data input and requires but a single one of two clock inputs to capture and hold output data but requires, for testing, two clock inputs comprising:

a negated AND circuit having a first input and a first clock input, coupled to means for providing selected signals to an AND/OR invert circuit, a multiplexer circuit, a second clock input and both data and scan inputs coupled to said multiplexer circuit, said multiplexer circuit coupling said scan or data inputs to said AND/OR invert circuit, a negated OR circuit coupled to and controlling said multiplexer circuit, said second clock input and said first input being coupled to and driving said negated OR circuit, and an output of said AND/OR invert circuit being indicative of the output of said multiplexer circuit.

25. The logic circuit of claim 24 wherein said multiplexer circuit comprises a first input transistor coupled to an input node and having a control electrode coupled to said second clock input and coupled in common with a capacitive node having a capacitance coupled thereto and a switching transistor, said AND/OR invert circuit comprises first and second transistors, coupled between a voltage source and ground and third and fourth transistors coupled between the voltage source and ground, said first, second, third and fourth transistors each having a respective control electrode, said second transistor having its control electrode coupled to said capacitive node having a capacitance coupled thereto and to the output and the control electrode of said fourth transistor through said switching transistor.

26. The logic circuit of claim 25 wherein said negated AND circuit comprises a first input transistor, having a control electrode coupled to said first input, in series, between a voltage source and ground, with a second input transistor, having a control electrode coupled to said first clock signal, and the negated OR circuit comprising a plurality of parallel decode transistors, coupled between said voltage source and ground, the output of said negated OR circuit being coupled to the control electrode of the switching transistor in said multiplexer circuit.

27. A latch comprising:

a circuit having an input and an output, and first and second and third legs, said first leg being coupled between a voltage source and ground and comprising a first transistor and a second transistor coupled to said output, said second leg being coupled between said voltage source and ground and comprising a third transistor and a fourth transistor coupled to said input, and said third leg being coupled between said voltage source and ground and comprising a fifth transistor having an output and a sixth transistor the control electrode of the fifth transistor being coupled to said first and third transistors, said first, second, third, fourth and fifth transistors each having a respective control electrode, the output of the fifth transistor being coupled to the control electrode of said second transistor and through a seventh transistor to the control electrode of said fourth transistor.

28. The latch of claim 27 wherein:

said circuit output includes an output line, coupled to the control electrode of the second transistor.

29. The latch of claim 28 wherein:

said input is coupled to a capacitive means, to a first signal source through an eighth transistor and to a second signal source through a ninth transistor.

* * * * *